United States Patent [19]

Nilsson

[11] Patent Number: 4,877,573
[45] Date of Patent: Oct. 31, 1989

[54] SUBSTRATE HOLDER FOR WAFERS DURING MBE GROWTH

[75] Inventor: Boo Nilsson, Hoffman Estates, Ill.

[73] Assignee: Litton Systems, Inc., Beverly Hills, Calif.

[21] Appl. No.: 270,409

[22] Filed: Nov. 7, 1988

Related U.S. Application Data

[63] Continuation of Ser. No. 39,757, Apr. 16, 1987, abandoned, which is a continuation of Ser. No. 811,064, Dec. 19, 1985, abandoned.

[51] Int. Cl.$^4$ .................... H01L 21/05; H01L 21/84; C30B 25/08; C30B 23/06
[52] U.S. Cl. .................................. 156/610; 118/728; 118/503
[58] Field of Search ................ 156/610, 611, 612; 118/724, 728, 729, 733, 725, 500, 503

[56] References Cited

U.S. PATENT DOCUMENTS

| | | | |
|---|---|---|---|
| 3,507,248 | 4/1970 | Seeley et al. | 118/725 |
| 3,589,936 | 6/1971 | Tramposch | 156/612 |
| 4,492,852 | 1/1985 | Finegan et al. | 118/725 |
| 4,592,307 | 6/1986 | Jolly | 118/733 |
| 4,699,083 | 10/1987 | Huet et al. | 118/724 |
| 4,806,321 | 2/1989 | Nishizawa et al. | 156/611 |

*Primary Examiner*—Willard Hoag
*Attorney, Agent, or Firm*—Elliott N. Kramsky

[57] ABSTRACT

A holder for supporting a compound semiconductor wafer such as GaAs during MBE heating includes a molybdenum ring, a tantalum ring for supporting the wafer therebetween uniformly about its outer edge, and a sapphire wafer, opposite the compound semiconductor wafer, fixedly attached to the molybdenum ring. The sapphire wafer prevents arsenic loss during heating and transmits infrared radiation to reach the compound semiconductor wafer.

21 Claims, 2 Drawing Sheets

SUBSTRATE HOLDER FOR WAFERS DURING MBE GROWTH

This is a continuation of co-pending application Ser. No. 039,757 filed on 4/16/87. (See XVIII below) which is a continuation of 811,064 filed on 12/19/85 both now abandoned.

BACKGROUND OF THE INVENTION

This invention relates to a holder for compound semiconductor wafers, such as gallium arsenide (GaAs) and indium phosphide (InP), during molecular beam epitaxial (MBE) growth. A holder is required during MBE growth for three reasons. First, it supports and protects the very brittle wafer from breakage during handling within the MBE system. Second, it serves as a hot plate to enable heating to temperatures for MBE growth (500-700 degrees Celsius). Third, it prevents loss of the more volatile element of the compound (eg. arsenic in GaAs) from the backside of the wafer during heating.

Prior art holders for GaAs wafers can be divided into two types. The first type of holder includes a plate made of molybdenum onto which the wafer is soldered with indium. The molybdenum plate serves as mechanical protection for the GaAs wafer. The radiation heater inside the MBE system heats the molybdenum plate and the indium serves as a medium for heat transfer to the GaAs wafer. Since indium is molten in the temperature range of interest, it will relieve any stress caused by the difference in thermal expansion between the GaAs wafer and the molybdenum plate. The surface tension of the molten indium also holds the GaAs wafer in place. While the indium holder has been in use for about ten years, there are several disadvantages to its use. The mounting and demounting of wafers using indium solder is impractical, time consuming and often causes the wafers to break. It is difficult to get uniform indium coverage under a larger wafer, and nonuniform coverage will result in nonuniform heating of the GaAs wafer and also causes the GaAs wafer to bow severely during growth. Finally, the indium has to be removed from the backside of the wafer after MBE growth prior to any further processing. This is often difficult since indium may be incorporated deep into the backside of the wafer during MBE growth.

A more recent technique that avoids the use and problems of indium uses a thin, evaporated refractory metal film on the backside of the wafer. The metal film now serves as the hot plate and transfers the heat to the GaAs wafer. The metal film also acts as a cap to prevent arsenic loss from the backside of the wafer. A molybdenum ring-shaped holder is used for mechanical protection. While this technique offers advantages over the indium technique, it, too, has disadvantages. Deposition of the refractory metal adds an additional process step during preparation of the wafer prior to MBE growth. Like the indium, this refractory metal film must be removed after MBE growth. Furthermore, the metal film also causes the wafer to bow during growth.

Therefore, it is an object of the present invention to provide a GaAs wafer holder that does not require processing of the wafer before or after MBE growth.

It is another object of the present invention to provide a GaAs wafer holder that minimizes bowing of the wafer during MBE growth.

Additional objects, advantages, and novel features of the invention will be set forth in part in the description which follows, and in part will become apparent to those skilled in the art upon examination of the following or may be learned by practice of the invention.

SUMMARY OF THE INVENTION

To achieve the foregoing and other objects, a holder for supporting a compound semiconductor wafer during MBE heating may comprise: a first ring; a second ring; a back plate fixedly attached to the second ring, the back plate being capable of transmitting infrared radiation; and support means for fixedly connecting the first ring to the second ring such that when the wafer is positioned between the first and second rings, the wafer is uniformly supported around its outer edge and an enclosed area is formed in the space between the wafer, the second ring and the back plate. Preferably the back plate is formed of sapphire.

BRIEF DESCRIPTION OF THE DRAWINGS

The invention is illustrated in the accompanying drawings in which.

DETAILED DESCRIPTION OF THE INVENTION

Figure 1:
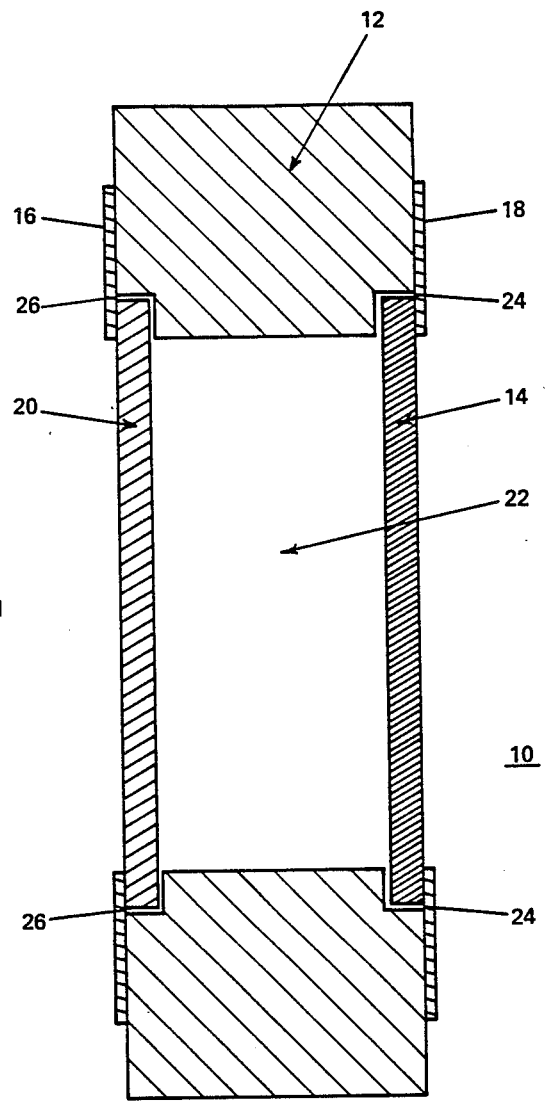
FIG. 1 is a cross-section of a holder and attached wafer.
Figure 2:
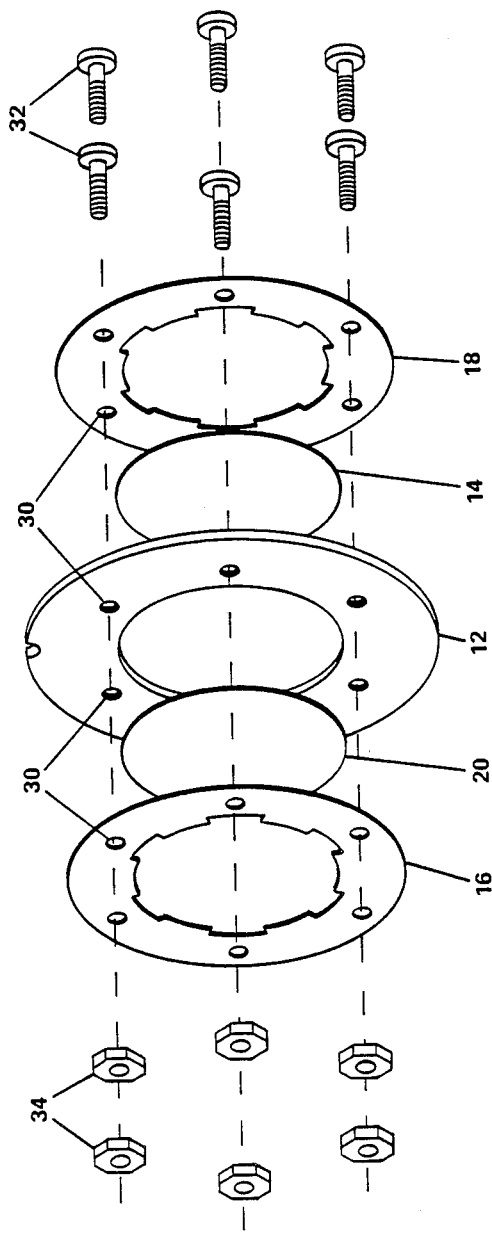
FIG. 2 is an exploded perspective view of the holder of FIG. 1.

Refering to FIGS. 1 and 2, holder 10 includes ring 12 which supports and separates wafer 20 from back plate 14. Back plate 14 is fixedly attached to ring 12. Here, back plate 14 is shown as positioned in seat 24 of ring 12 by ring 18. Preferably ring 18 is a thin tantalum plate. Holes 30 are provided in rings 18 and 12 for the placement of screws 32 to secure ring 18 to ring 12. These holes are shown as uniformly spaced apart. Similarily, wafer 20 is shown as positioned in seat 26 of ring 12 and held in place by ring 16. Also, preferably ring 16 is formed of tantalum. Ring 16 is shown here attached to ring 12 by the placement of nuts 34 and screws 32 in holes 30 uniformly spaced apart in rings 12 and 16.

Preferably ring 12 is formed of molybdenum and is constructed to have sufficient mechanical support. The back plate is permanently mounted to prevent arsenic loss from the backside of a GaAs wafer and does not interfere with heating of the GaAs wafer. The use of tantalum for rings 16 and 18 minimizes heat transfer from molybdenum ring 12.

The wafer holder of the present invention does not require pre-or-post-processing of the wafer because no materials are deposited on the wafer which have to be removed. The holder is particularly useful for MBE growth on GaAs and InP wafers. Formation of space 22 is formed when the wafer is placed in the holder and creates a region of arsenic overpressure which prevents loss of arsenic during MBE growth. The GaAs wafer is uniformly supported around its outer edge, thus minimizing bowing of the wafer during MBE growth.

The back plate cannot be in contact with the wafer since that can cause local hot spots on the wafer due to heat conduction. The wafer and substrate are preferably spaced 50 mil apart. Since the back plate will be heated slightly (approx. 300 degrees Celsius), the sticking coefficient for arsenic can be assumed to be almost zero. This results in local overpressure of arsenic preventing the backside of the GaAs wafer from degradation. The sealing of the area is not perfect but experiments have shown that the build up of arsenic overpressure is sufficient to prevent wafer degradation up to a least 650 degrees Celsius. An attempt was made to heat a GaAs wafer without the use of a back plate. This resulted in severe degradation of the backside of the GaAs wafer changing the emissivity of the GaAs wafer and causing it to rapidly overheat.

The material used for the back plate must be carefully selected. First, it must be ultra high vacuum compatible (i.e. have a very low vapor pressure at elevated temperatures). The substrate should also, if possible, be transparent in the wavelength region where a wafer such as GaAs is absorbent, this will enable a more efficient heating of the GaAs wafer. Finally the back plate should be reasonably priced and have some mechanical strength and hardness.

Examples of suitable substrate materials include silicon (Si), gallium phosphide (GaP), pyrolytic boron nitride (PBN) and sapphire. Silicon was used in initial experiments and was found to work quite well. However since Si is less transparent than GaAs in the temperature region of interest, the heating is less efficient. The Si wafer actually gets hotter than the GaAs wafer during typical MBE growth conditions. Sapphire was found to be superior to Si since it is transparent in the visible region thereby allowing a much more efficient heating of the GaAs wafer. GaP is expensive and very brittle. PBN is expensive and has poor transparency in the visible region.

A properly designed mechanical support is the key to maintaining a good flatness of the wafer during growth. Three clips holding the wafer down were initially tried. This resulted in severe bowing of the wafer near the contact point of the clips. The reason for this bowing is local heating by conduction from the clips. The clips and the surrounding molybdenum ring will always be hotter than the GaAs wafer since these metal parts will absorb heat radiation more efficiently than GaAs.

The ring-shaped tantalum plate shown in FIG. 1 minimizes heat conduction from the hotter molybdenum ring to the GaAs wafer. An identical tantalum plate is used to hold the back plate in place. This back plate also acts as a radiation shield and thereby reduces the temperature of the molybdenum ring. This holder design resulted in a much improved flatness as compared to an early version with clips.

I claim:
1. Apparatus for holding a semi-conductor wafer during heating by radiation comprising:
    (a) an apertured support means defining spaced-apart faces for receiving a generally-planar backplate and a wafer in spaced-apart substantially parallel relationship to define an enclosed volume through which radiation can pass;
    (b) said backplate being fabricated of material selected from the group consisting of gallium phosphide, pyrolytic boron nitride and sapphire; and
    (c) means for retaining said backplate and said wafer in said support means.
2. The apparatus of claim 1 wherein said enclosed volume is sealed sufficiently to be capable of creating an overpressure of vapor emitted by said wafer during said heating.
3. The apparatus of claim 1 wherein said support means having a structure for holding said wafer around the periphery of said wafer.
4. Semi-conductor fabrication apparatus for use in a molecular beam epitaxy (MBE) growth process comprising in combination:
    (a) an apertured support means defining spaced-apart faces for receiving a generally-planar backplate and a semi-conductor wafer in a spaced-apart, substantially parallel relationship, said means, said backplate and said semi-conductor wafer defining an enclosed volume;
    (b) said backplate being fabricated of sapphire; and
    (c) means for retaining said backplate and said wafer in said support means.
5. Apparatus as defined in claim 4 wherein said wafer is fabricated of GaAs.
6. Apparatus as defined claim 4 wherein said wafer is fabricated of InP.
7. Apparatus as defined in claim 4 wherein said wafer is fabricated of a compound semi-conductor.
8. Semi-conductor fabrication apparatus for use in a molecular beam epitaxy (MBE) growth process comprising in combination:
    (a) an apertured support means defining spaced-apart faces for receiving a generally-planar backplate and a semi-conductor wafer in a spaced-apart, substantially parallel relationship defining an enclosed volume;
    (b) said backplate being fabricated of gallium phosphide; and
    (c) means for retaining said backplate and said wafer in said support means.
9. Apparatus as defined in claim 8 wherein said wafer is fabricated of GaAs.
10. Apparatus as defined in claim 8 wherein said wafer is fabricated of InP.
11. Semi-conductor fabrication apparatus for use in a molecular beam epitaxy (MBE) growth process comprising in combination:
    (a) an apertured support means defining spaced-apart faces for receiving a generally-planar backplate and a semi-conductor wafer in a spaced-apart, substantially parallel relationship defining an enclosed volume;
    (b) said backplate being fabricated of pyrolytic boron nitride; and
    (c) means for retaining said backplate and said wafer in said support means.
12. Apparatus as defined in claim 11 wherein said wafer is fabricated of GaAs.
13. Apparatus as defined in claim 11 wherein said wafer is fabricated of InP.
14. In a method for molecular beam epitaxy (MBE) growth of a film on a wafer of a first semiconductor material where the improvement comprises the steps of:
    (a) forming an apertured support means defining two spaced-apart faces; and
    (b) forming a backplate of a second material that differs from said first material, said second material being sufficiently transparent to radiation in a wavelength region that is absorbed by said wafer to allow heating of said wafer to a higher temperature than said backplate; then
    (c) mounting said generally-planar semi-conductor wafer adjacent to one of said two opposed faces of said apertured support means: and
    (d) mounting said backplate adjacent to the other of said two opposed faces of said apertured support means so that said wafer and said backplate are in a spaced-apart, substantially parallel relationship defining an enclosed volume through which infrared radiation can pass; and then

(e) heating said wafer by directing radiation of said predetermined wavelength at said backplate whereby a portion of said radiation passes through said enclosed volume to said wafer.

15. A method as defined in claim 14 when said wafer is of GaAs.

16. A method as defined in claim 14 employing a backplate of sapphire.

17. A method as defined in claim 16 wherein said wafer is of GaAs.

18. A method as defined in claim 16 wherein said backplate is fabricated of material from the group consisting of boron nitride and gallium phosphide.

19. A method as defined in claim 16 wherein said wafer is fabricated of InP.

20. A method as defined in claim 16 wherein said wafer is formed of a compound semi-conductor.

21. In a method for growing a layer on a wafer of semiconductor material of the type wherein radiation is directed at a backplate positioned in an MBE system intermediate said wafer and said incoming radiation, the improvement comprising the steps of:

(a) forming said backplate of material that differs from said wafer; and (b) selecting the material of said backplate to be of sufficient transparency to said radiation in a wavelength region that is absorbed by said wafer material so that said wafer is heated by said radiation to a higher temperature than said backplate.

* * * * *